(12) United States Patent
Byrne et al.

(10) Patent No.: US 6,205,029 B1
(45) Date of Patent: Mar. 20, 2001

(54) MODULAR POWER SUPPLY CHASSIS EMPLOYING A BUS BAR ASSEMBLY

(75) Inventors: Vincent M. Byrne, Mesquite; Edward C. Fontana, Rockwall, both of TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/069,368

(22) Filed: Apr. 29, 1998

Related U.S. Application Data (63) Continuation-in-part of application No. 08/749,258, filed on Nov. 15, 1996, now Pat. No. 5,969,938.

(51) Int. Cl.[7] .................................................. H05K 7/16
(52) U.S. Cl. ..................... 361/724; 361/727; 361/796; 361/611; 361/624; 361/637; 361/648; 174/68.2
(58) Field of Search ................................. 361/724, 799, 361/796, 752, 727, 614, 611, 622, 624, 648, 725; 363/142, 144; 307/43, 44, 77, 84, 85, 86, 146, 147, 150; 174/68.2, 72 B, 88 B (56) References Cited

U.S. PATENT DOCUMENTS

| | | |
|---|---|---|
| 3,478,299 | 11/1969 | Cinati et al. ........................... 339/64 |
| 3,493,818 | 2/1970 | Pappe et al. ........................... 317/122 |
| 4,025,826 | 5/1977 | Wilson et al. ......................... 361/334 |
| 4,077,687 | 3/1978 | Farag ................................ 339/64 M |
| 4,121,276 | 10/1978 | Kovatch et al. ...................... 361/342 |
| 4,180,845 | 12/1979 | Shariff et al. ........................ 361/334 |
| 4,180,846 | 12/1979 | Wilson et al. ........................ 361/357 |
| 4,242,718 | * 12/1980 | Shariff et al. ........................ 361/341 |
| 4,307,304 | * 12/1981 | Kovatch et al. ...................... 307/147 |
| 4,498,717 | * 2/1985 | Reimer ............................ 339/17 LM |
| 4,685,032 | 8/1987 | Blomstedt et al. ................... 361/412 |
| 5,379,184 | 1/1995 | Barraza et al. ....................... 361/685 |
| 5,515,236 | 5/1996 | Nolan et al. ......................... 361/652 |
| 5,801,921 | * 9/1998 | Miller .................................. 361/686 |

\* cited by examiner

*Primary Examiner*—Leo P. Picard
*Assistant Examiner*—Tung Minh Bui (57) ABSTRACT

A chassis assembly for receiving power supply modules therein. The chassis assembly includes: (1) a cabinet, (2) an elongated bus bar assembly configured to be supported within the cabinet from a mount coupled to the cabinet, the bus bar assembly having a pair of conductors capable of receiving a terminal connector of a power supply module received into the cabinet and (3) a shelf, oriented laterally with respect to the bus bar assembly, that supports at least one power supply module received into the cabinet, the bus bar assembly being substantially free of terminal connectors and adapted to eliminate a need for support of a portion of a weight of the bus bar assembly apart from the mount.

41 Claims, 9 Drawing Sheets

MODULAR POWER SUPPLY CHASSIS EMPLOYING A BUS BAR ASSEMBLY

CROSS-REFERENCE TO RELATED APPLICATIONS

This application is a continuation-in-part of U.S. patent application Ser. No. 08/749,258, entitled "Modular Power Supply Chassis Employing a Suspended Bus Bar Assembly," to Byrne, et al., filed on Nov. 15, 1996, now U.S. Pat. No. 5,969,938. The above-listed application is commonly assigned with the present invention and is incorporated herein by reference as if reproduced herein in its entirety.

TECHNICAL FIELD OF THE INVENTION

The present invention is directed, in general, to a modular power supply and, more specifically, to a modular power supply chassis employing a bus bar assembly.

BACKGROUND OF THE INVENTION

It is not uncommon to find a power supply having a plurality of slots for receiving individual power supply modules. The modular architecture provides several advantages, including: granularity in the level of power that may be delivered to a load, tolerance of failure of one module without interruption of service, and an increase in the overall reliability of the system by sharing the load requirements among a plurality of redundant power supply modules. Additionally, the modular architecture enhances the flexibility of the power supply by allowing individual modules to be replaced with upgraded or enhanced modules without interruption of service. Finally, the modular architecture provides a robust system whereby untrained personnel can rapidly replace failed modules without interrupting service.

Conventionally, the power supply may employ multiple converters in separate modules that convert an AC or DC input voltage to an AC or DC output voltage. Again, the power supply may employ multiple converters in separate modules to increase the overall capacity and reliability of the power supply. The converters, in such a system, share the load to, among other things, evenly distribute stresses among the separate modules, while providing a regulated output to the load. Also, when a failure occurs in a modular system, it is possible to identify and shut down the failed unit without affecting the other parallel connected units, thereby minimizing the overall effects on the input of the load equipment.

Structurally, the modular power supply is housed in a chassis or framework that provides support for shelves that contain the individual power supply modules. The chassis generally includes U-shaped uprights that the shelves and other equipment of the modular power supply are attached to. The chassis further includes compartmentalized rear, side and often top panels to cover the power supply modules and other components that make-up the modular power supply. The chassis and panels form an exo-skeletal cabinet for the modular power supply. The chassis is often a freestanding framework with the panels added for aesthetic and safety purposes. The chassis may be mounted in an equipment cabinet and the shelves accommodate multiple power supply modules.

The modular power supply further includes a power distribution system that distributes power to and from the power supply modules therein. For instance, commercially provided AC power derived from the local utility is fed into the power supply modules, converted by the power supply modules (e.g., in this case, the power converter modules) and DC power is provided to a load coupled to the modular power supply via a power bus architecture. The input and output power, therefore, are distributed through the modular power supply by the power distribution system.

The power bus architecture generally includes a plurality of horizontal bus bars couplable to the power supply modules. The horizontal bus bars are typically supported by horizontal braces within the chassis or within the power unit tray. The horizontal bus bars are coupled together by at least one vertical main power bus. In addition to coupling the horizontal bus bars together, the main power bus provides a path for the output power to the load. Therefore, the power bus architecture of the modular power supply includes a plurality of horizontal bus bars and a vertical main power bus.

The construction of the modular power supply generally occurs according to the following general steps. First, the chassis is constructed providing the structural framework for the modular power supply. Second, the power distribution system is coupled to the frame. Third, power unit trays are individually loaded into the chassis proximate the horizontal braces. Fourth, power supply modules are placed on the power unit trays. In conjunction with loading the power supply modules onto the trays, the power supply modules are coupled to the AC input and control terminals and to the horizontal bus bars. Finally, panels may be placed about the chassis to complete the modular power supply.

While the present designs for the cabinet and power distribution system provide a workable construction for a modular power supply, there are limitations with such designs. The power supply modules dissipate heat in the process of generating or converting power. To promote the safe and efficient operation of the modular power supply, the heat must be removed from within the cabinet. Further, the modular power supply may be placed against a wall, back to back with another equipment frame, or even with equipment frames on both sides, thereby limiting ventilation to the sides or rear. The horizontal bus bars impede the airflow within the chassis. Consequently, powerful fans capable of moving a sufficient quantity of air through the chassis must be provided in connection with the power supply modules, and this air may be forced to exhaust upward.

In combination therewith, the chassis of the modular power supply must be of sufficient depth to provide a channel that facilitates the removal of the exhaust air upward from the power supply modules. The modular power supply, therefore, occupies a great deal of valuable floor space to accommodate the depth requirements compelled with the use of the horizontal bus bars in the power distribution system.

In addition, the location for the power supply modules is predetermined vertically by the positioning of connecting points on the main power bus. Thus, the fixed vertical increments for the location of the power supply modules prevalent in the prior art systems severely limits the flexibility of the power supply. For instance, if the power supply must be redesigned and a taller power supply module is to be employed, a total rework of the chassis must be undertaken to accommodate the taller module. Conversely, while the use of a smaller power module is possible, the ensuing extra space cannot be used thereby generating wasted space in the modular power supply.

Accordingly, what is needed in the art is a power distribution system having a simplified power bus architecture that facilitates a reduction of the overall footprint of the modular power supply by minimizing airflow restrictions therethrough and provides enhanced design flexibility not available in the prior art.

SUMMARY OF THE INVENTION

To address the above-discussed deficiencies of the prior art, the present invention provides a chassis assembly for receiving power supply modules therein. In one embodiment, the chassis assembly includes: (1) a cabinet, (2) an elongated bus bar assembly configured to be supported within the cabinet from a mount coupled to the cabinet, the bus bar assembly having a pair of conductors capable of receiving a terminal connector of a power supply module received into the cabinet and (3) a shelf, oriented laterally with respect to the bus bar assembly, that supports at least one power supply module received into the cabinet, the bus bar assembly being substantially free of terminal connectors and adapted to eliminate a need for support of a portion of a weight of the bus bar assembly apart from the mount.

The present invention therefore introduces, among other things, a mount that supports a bus bar assembly within a cabinet to reduce the structural members that the bus bar assembly would otherwise require. This is in distinct contrast to bus bar design concepts found in the prior art, wherein complicated bus bar supports were required to maintain the bus bars in the proper location. Inasmuch as the mount bears a portion of the weight of the bus bar assembly, ancillary supports may be limited to providing support as against lateral or fore and aft displacement of the bus bar assembly. It should be appreciated that fore and aft is usually in the direction of insertion into and removal out of the cabinet. Additionally, the mount may be positioned at a top portion of the cabinet thereby suspending or hanging a bus bar assembly within a cabinet. Alternatively, the mount may be located at a lower position of the cabinet thereby supporting the bus bar assembly from below. The broad scope of the present invention is not limited to the mount being positioned in a particular location.

The present invention is applicable to modular power supplies such as modular converters including modular rectifiers (one type of modular converter). Additionally, the present invention provides a bus bar assembly that can accommodate multiple sizes of power supply modules. By alternatively including the terminal connector in the module, itself, the module can theoretically be located at any elevation of the bus bar assembly. Obviously, this characteristic enhances the flexibility in the design of the modular power supply.

In one embodiment of the present invention, the shelf includes a power outlet and a control bus interface associated therewith, the power outlet configured to mate with and provide electrical power to the power supply module, the control bus configured to mate with and provide control signals to the power supply module. In an embodiment to be illustrated and described, the power supply module (or rectifier, for instance) is installed into the chassis assembly by being pushed rearwardly into the cabinet until the terminal connector thereof mates with the conductors and the power outlet and control bus interface mate with connectors on the module. Mating may be simultaneous or staged, as desired. Removal of the power supply module involves pulling the module from the cabinet or framework.

In one embodiment of the present invention, the bus bar assembly includes a plurality of pairs of conductors and a pair of cross-connecting conductors that electrically couple corresponding conductors of the plurality of pairs of conductors. Some embodiments to be described herein have three pairs, others four. Those skilled in the art should understand, however, that the present invention is in no way limited by the number of conductor pairs provided in a given cabinet or the spacing of the conductor pairs.

In one embodiment of the present invention, the chassis assembly further includes a lateral support member coupling the bus bar assembly and the shelf, the lateral support member limiting a lateral movement of the bus bar assembly relative to the shelf. The lateral support member may be a simple, lightweight structure, as it is not necessary to bear any portion of the weight of the bus bar assembly. The lateral support member is also capable of limiting a fore and aft movement of the bus bar assembly relative to the shelf.

In one embodiment of the present invention, the cabinet includes a rear wall, a rear edge of the shelf being separated from the rear wall to form a passageway, the bus bar assembly passing through the passageway, the passageway providing a path for convective air currents within the cabinet. In an embodiment to be illustrated and described, the passageway provides substantially more area for vertical airflow over the prior art. An active fan may be located proximate the passageway to stimulate air flow about the power supply modules.

In one embodiment of the present invention, the terminal connectors include opposing spring-biased contacts adapted to spread apart resiliently about the pair of conductors. The spring-biased contacts allow the conductors to be inserted into or removed from the terminal connectors and permit the transmission of high currents without requiring further attachment steps, such as discrete fasteners (bolts, screws, positive engagement or the like). Of course, other types of terminal connectors (e.g., separately opposing contacts about the conductors) are well within the broad scope of the present invention.

In one embodiment of the present invention, an insulating structure separates the pair of conductors and maintains the pair of conductors in a fixed relative relationship. The insulating structure, while not required, allows the pair of conductors to be located closer together than otherwise allowed. The insulating structure may further provide structural rigidity to the pair of conductors.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
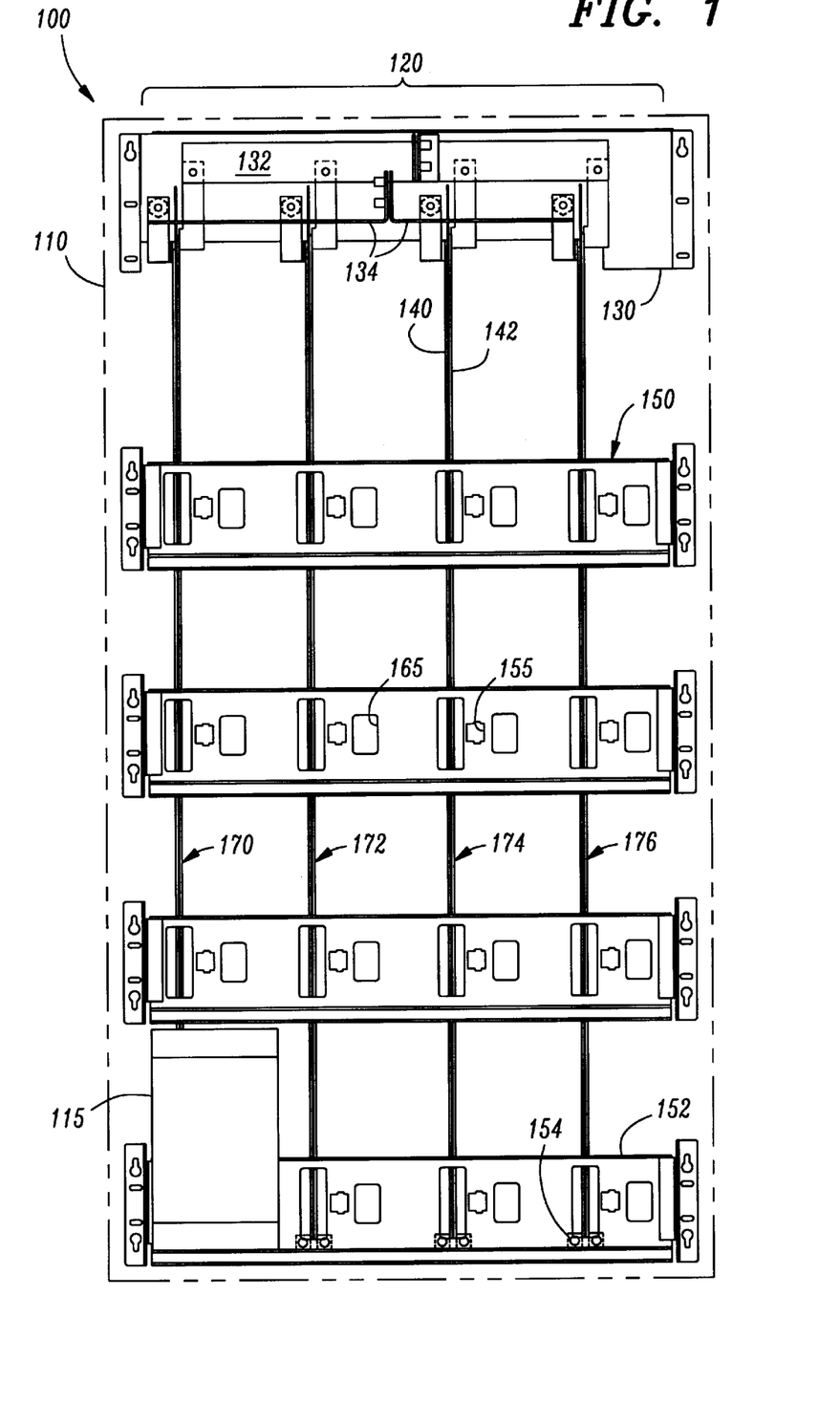
FIG. 1 illustrates a front view of an embodiment of a chassis assembly constructed according to the principles of the present invention.

Referring initially to FIG. 1, illustrated is a front view of an embodiment of a chassis assembly 100 constructed according to the principles of the present invention. The chassis assembly 100 comprises an open front cabinet 110 having compartmentalized panels (not shown) formed of sheet metal to cover the power supply modules (one of which is illustrated and designated 115) and other components that comprise a modular power supply. The chassis assembly 100 also includes an elongated bus bar assembly (generally designated 120) supported (e.g., suspended) within the cabinet 110 from a mount 130 coupled to the cabinet 110 at an upper end thereof. The bus bar assembly 120 includes a pair of conductors (one pair of which is referenced as 140, 142) associated therewith for receiving output terminal connectors (see ensuing FIGURES) of the power supply modules 115 received into the cabinet 110.

The chassis assembly 100 further includes a plurality of shelves (one of which is referenced as 150) oriented laterally with respect to the bus bar assembly 120. The plurality of shelves 150 provide support for the plurality of power supply modules 115 coupled to the bus bar assembly 120. The chassis assembly 100 still further includes a central rectifier control system having a plurality of control bus interfaces (one of which is referenced as 155) distributed within the cabinet 110 to allow the central rectifier control system to coordinate the operation of the plurality of power supply modules 115.

The plurality of shelves 150 also include a plurality of power outlets (one of which is referenced as 165) associated therewith. The plurality of power outlets 165 mate with and provide electrical power to the plurality of power supply modules 115. The conductors 140, 142 mate with and receive converted electrical power from terminal connectors (see ensuing FIGURES) affixed to the plurality of power supply modules 115. Of course, the control bus interfaces 155 and power outlets 165 may be located at other locations within the cabinet 110 such as on a rear wall of the cabinet 110.

In the illustrated embodiment, the bus bar assembly 120, includes four parallel pairs of conductors (a first, second, third and fourth vertical pair of conductors 170, 172, 174, 176) and a pair of cross-connecting conductors (a first and second cross-connecting conductor 132, 134) that electrically couple corresponding conductors of the four parallel pairs of conductors 170, 172, 174, 176. One skilled in the art will recognize that the present invention is in no way limited by the number of conductor pairs provided in a given cabinet or the spacing of the conductor pairs. Additionally, in the case of a single conductor pair, the cross-connecting connectors may be omitted.

A shelf 152, at the base of the cabinet 110, comprises a lateral support member 154 which couples the bus bar assembly 120 to the shelf 152 with the intent to restrict lateral or fore and aft movement of the bus bar assembly 120 during installation and removal of power supply modules 115. Inasmuch as the mount 130 bears substantially all of the weight of the bus bar assembly 120, additional ancillary supports are not required. Thus, the parallel pairs of conductors 170, 172, 174, 176 are substantially free of any connectors, fasteners or other obstructions to the vertical placement of power supply modules 115. Therefore, shelves 150 may be located at varying vertical distances to most efficiently accommodate power supply modules 115 of different sizes.

Figure 2:
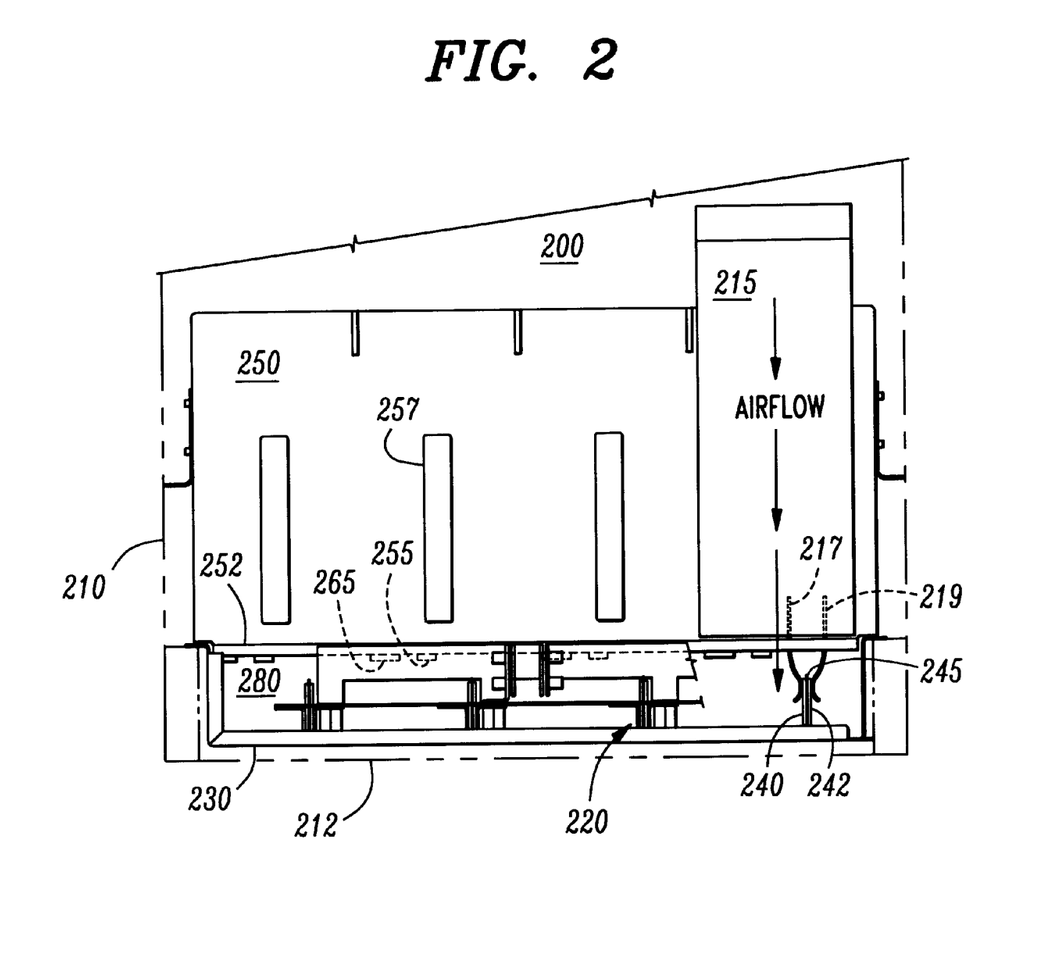
FIG. 2 illustrates a top view of an embodiment of a chassis assembly constructed according to the principles of the present invention.

Turning now to FIG. 2, illustrated is a top view of an embodiment of a chassis assembly 200 constructed according to the principles of the present invention. The chassis assembly 200 receives power supply modules (such as a rectifier 215) therein. Analogous to the chassis assembly 100 of FIG. 1, the chassis assembly 200 includes a cabinet 210, an elongated bus bar assembly 220 supported (e.g., suspended) within the cabinet 210 from a mount 230 coupled to the cabinet 210 at an upper end thereof. Within the cabinet 210, one or more shelves 250, oriented laterally with respect to the bus bar assembly 220, support the rectifiers 215 received into the cabinet 210. The bus bar assembly 220 comprises a pair of conductors (one pair of which is referenced as 240, 242) and an insulating structure 245 which separates the conductors 240, 242 and maintains the pair of conductors 240, 242 in a fixed relative relationship.

The shelf 250 includes a plurality of power outlets (one of which is referenced as 265) and a plurality of control bus interfaces (one of which is referenced as 255) associated therewith. The power outlets 265 mate with and provide electrical power to the corresponding rectifiers 215. The control buses 255 mate with and provide control signals to the corresponding rectifiers 215. The bus bar conductors 240, 242 mate with and receive converted electrical power from the terminal connectors (one pair of which is referenced as 217, 219) on the rear of the rectifier 215. Furthermore, a rear edge 252 of the shelf 250 is separated from a rear wall 212 to form a passageway 280. The bus bar assembly 220, passing through the passageway 280, provides a minimal obstruction to convective air currents within the cabinet 210. The minimal cross sections of the vertical bus bar assembly 220 causes minimal impediment to the motion of cooling air through the passageway 280. The shelf 250 also includes rails (one of which is referenced as 257) for aligning rectifiers 215 thereon. In many cases, the rectifier 215 includes a fan (not shown) to facilitate the convective air currents within the cabinet 210. Although the illustrated embodiment shows airflow from the lower front of the chassis assembly to the top rear of the chassis assembly, one skilled in the art will recognize that airflow may also be from back to front or even vertically within the chassis assembly while remaining within the scope and intent of the present invention.

Figure 3:
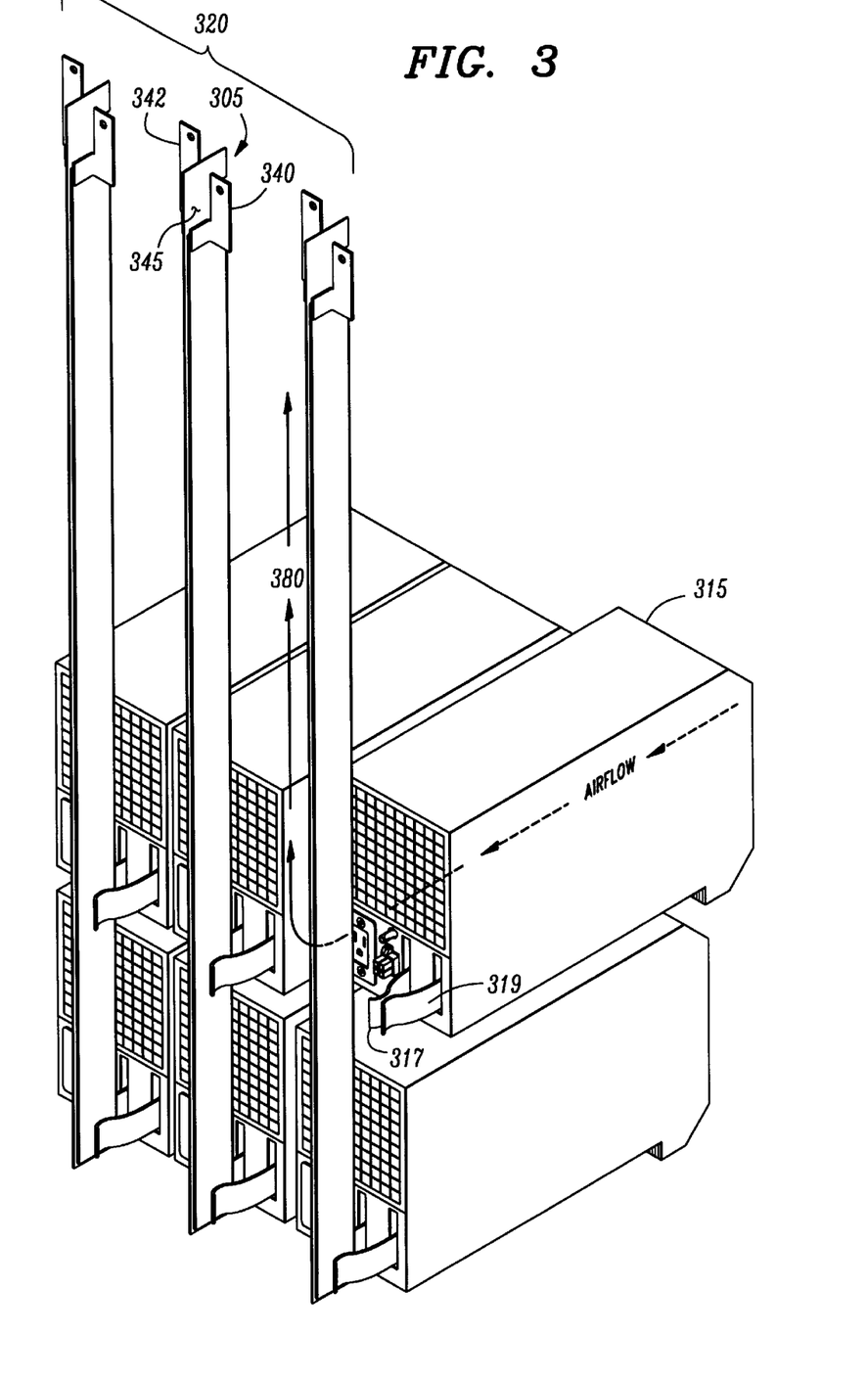
FIG. 3 illustrates an isometric rear view of three parallel pairs of conductors of an embodiment of a bus bar assembly constructed according to the principles of the present invention.

Turning now to FIG. 3, illustrated is an isometric rear view of three parallel pairs of conductors (one of which is referenced as 305) of an embodiment of a bus bar assembly 320 constructed according to the principles of the present invention. More specifically, each parallel pair of conductors 305 include a first conductor (one of which is referenced as 340) and second conductor (one of which is referenced as 342). Each parallel pair of conductors 305 also includes an insulating structure (one of which is referenced as 345) separating the first and second conductors 340, 342 and maintaining the first and second conductors 340, 342 in a fixed relative relationship. Output terminal connectors 317, 319 of a plurality of rectifiers (one of which is referenced as 315) are coupled to the conductors 340, 342. The plurality of rectifiers 315 in conjunction with a cabinet (not shown), bus bar assembly 320, plurality of shelves (not shown) and central rectifier control system (not shown) constitute a modular rectifier. Air flowing through the plurality of rectifiers 315 generally flows from the front to the rear thereof and vertically through passageway 380 upward to the top of the bus bar assembly 320 as shown.

Figure 4:
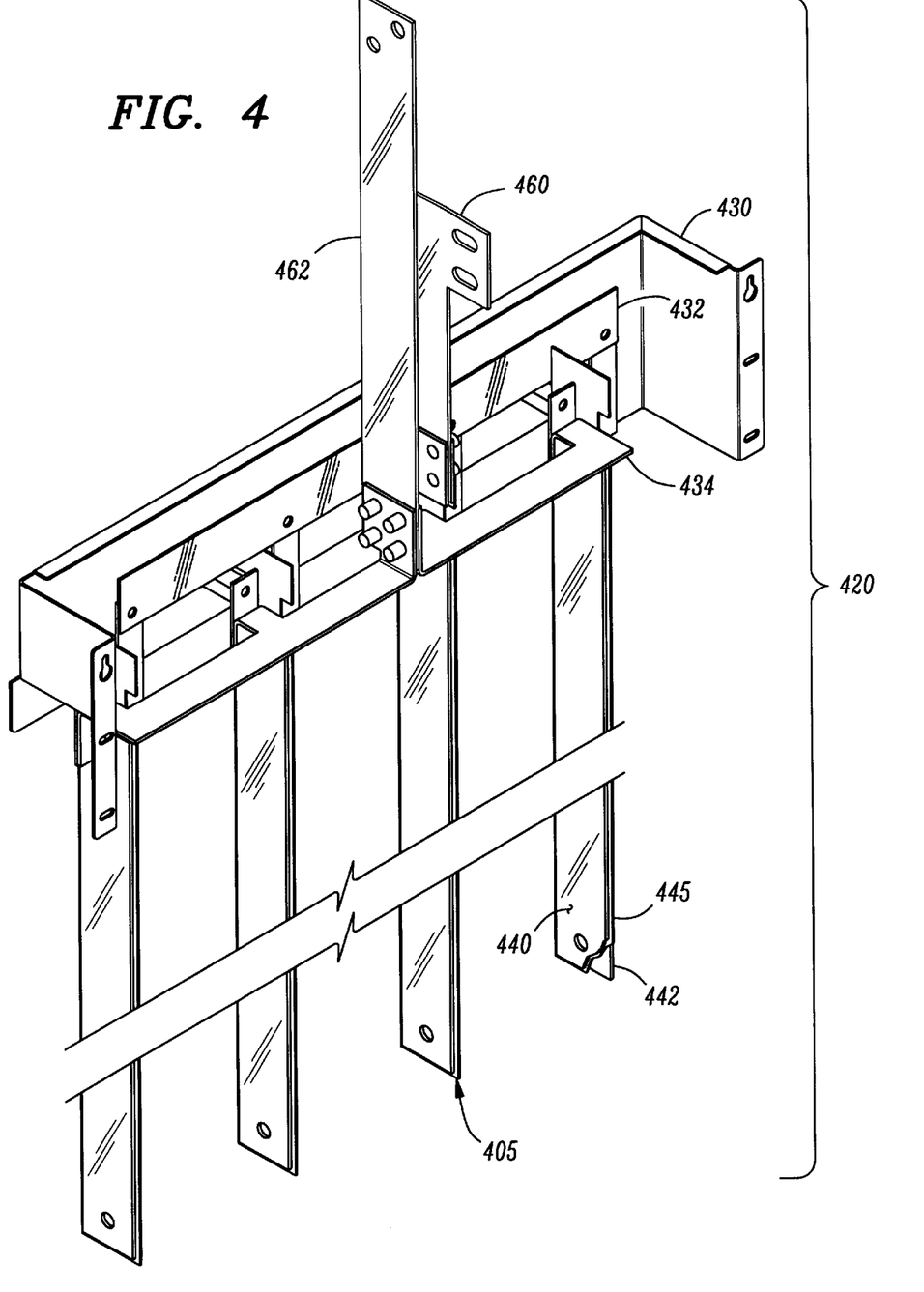
FIG. 4 illustrates an isometric front view of an embodiment of a bus bar assembly constructed according to the principles of the present invention.

Turning now to FIG. 4, illustrated is an isometric front view of an embodiment of a bus bar assembly 420 constructed according to the principles of the present invention. The bus bar assembly 420 is supported (e.g., suspended) within a cabinet of a chassis assembly (not shown) from a mount 430 coupled to the cabinet at an upper end thereof. The illustrated bus bar assembly 420 comprises four parallel pairs of conductors (one pair of which is referenced as 440, 442) and a pair of cross-connecting conductors 432, 434 that electrically couple corresponding conductors of the four parallel pairs of conductors 440, 442. An insulating structure 445 separates the pair of conductors 440, 442 and maintains the pair of conductors 440, 442 in a fixed relative relationship. The bus bar assembly 420 also includes a main power bus 460, 462 for delivering power to a load coupled thereto.

Figure 5:
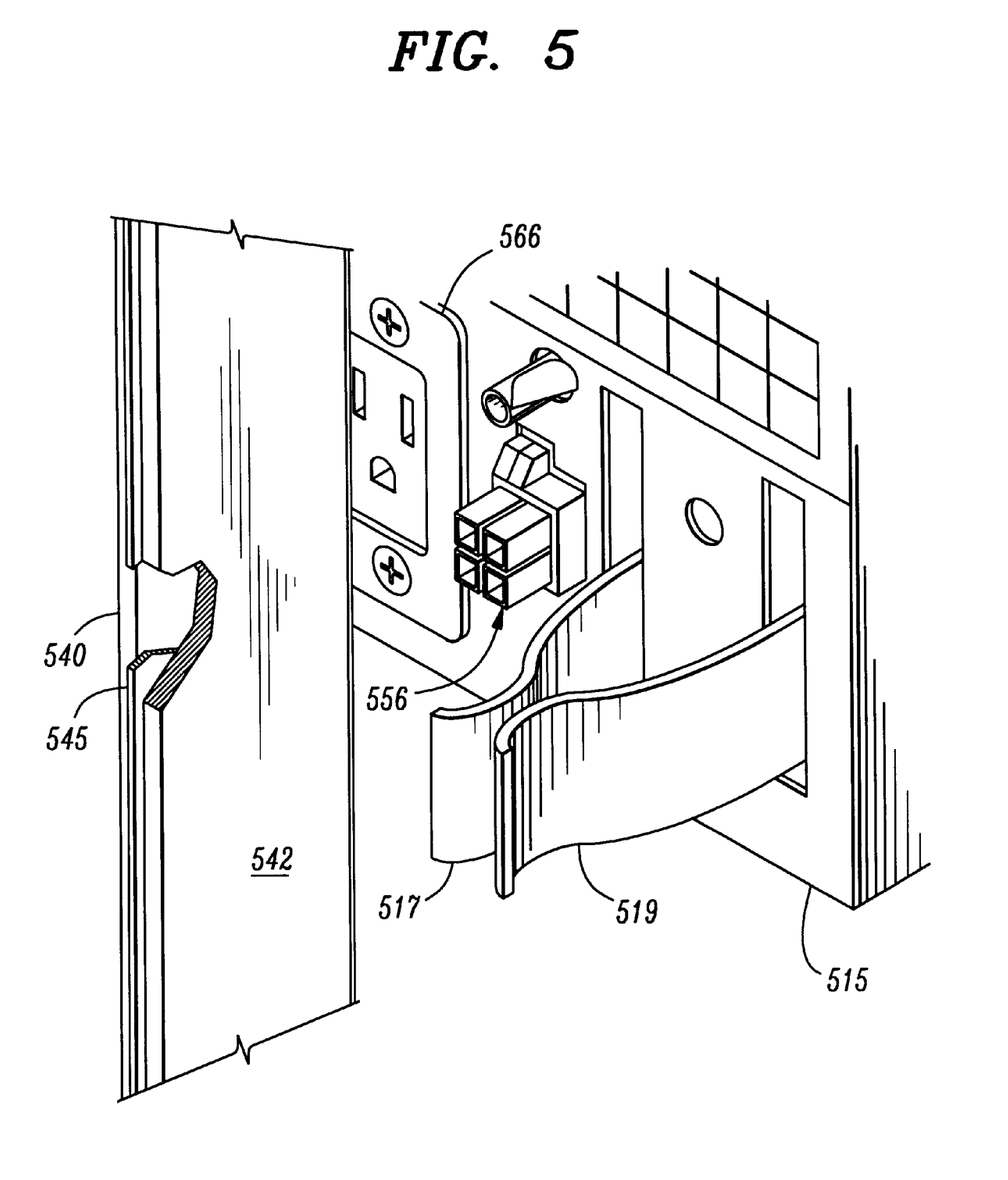
FIG. 5 illustrates an isometric rear view of an embodiment of a power supply module prior to engaging a pair of conductors.
Figure 6A:
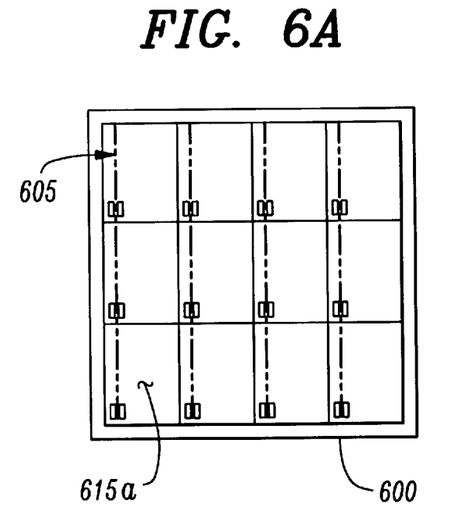
FIGS. 6A, 6B, 6C and 6D, illustrate a highly schematic view of four different configurations of a bus bar assembly employing the same external cabinet when constructed according to the present invention.
Figure 6B:
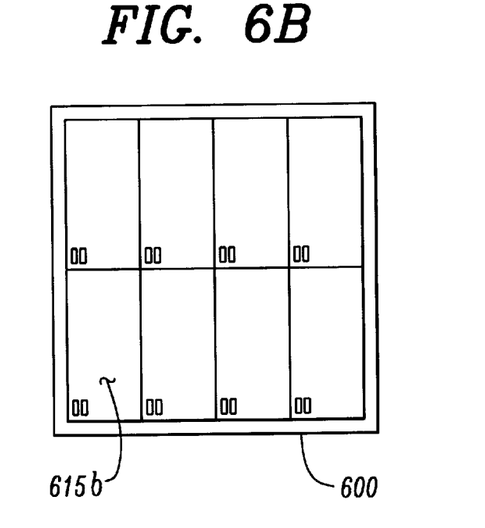
Figure 6C:
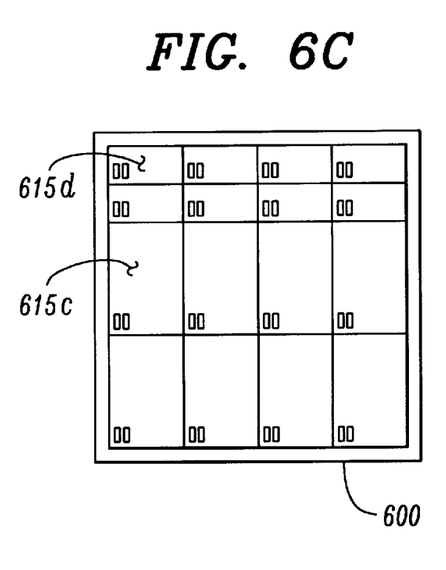
Figure 6D:
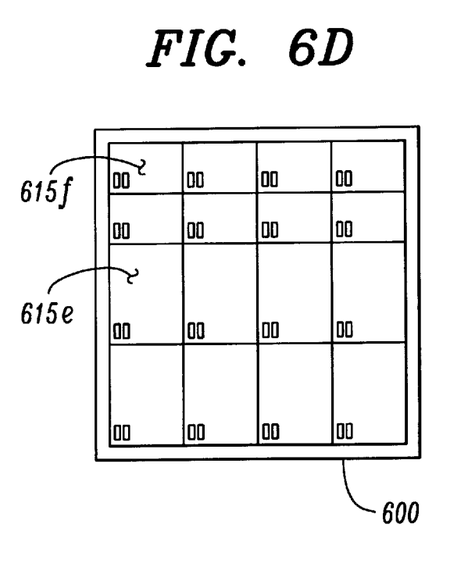

Turning now to FIG. 5, illustrated is an isometric rear view of an embodiment of a power supply module prior to engaging a pair of conductors. The power supply module 515 includes an input power connector 566, for receiving input power from a power outlet of the chassis assembly (not shown), and a control interface 556, for receiving control signals to control the power supply module 515. Terminal connectors 517, 519 comprise opposing spring-biased contacts which allow the terminal connectors 517, 519 to spread apart resiliently about insulator 545 and a pair of conductors 540, 542 and permit the transmission of high currents without requiring further attachment steps; bolts, screws, etc. Typically, the power supply module 515 is installed into the chassis assembly by being pushed rearwardly into the cabinet until it mates with the power outlet (not shown), control bus interface (not shown) and a pair of conductors 540, 542.

Referring now to FIGS. 6A, 6B, 6C and 6D, illustrated are highly schematic views of four different configurations of a bus bar assembly employing the same external cabinet 600 when constructed according to the present invention. The cabinet 600 comprises four suspended conductor pairs 605 (see FIG. 6A) within a cabinet height of 24 inches. The configuration illustrated in FIG. 6A accommodates three 8-inch high power supply modules 615a for each of the four columns. The configuration illustrated in FIG. 6B accommodates two 12-inch high power supply modules 615b within each of the four columns. The configuration illustrated in FIG. 6C accommodates two 9-inch high power supply modules 615c and two 3-inch high power supply modules 615d for each of the four columns. The final configuration illustrated in FIG. 6D accommodates two 8-inch high power supply modules 615e and two 4-inch high power supply modules 615f within each of the four columns. Although four specific configurations have been illustrated, those skilled in the art will recognize that other combinations for the power supply modules are possible within the same cabinet.

Figure 7:
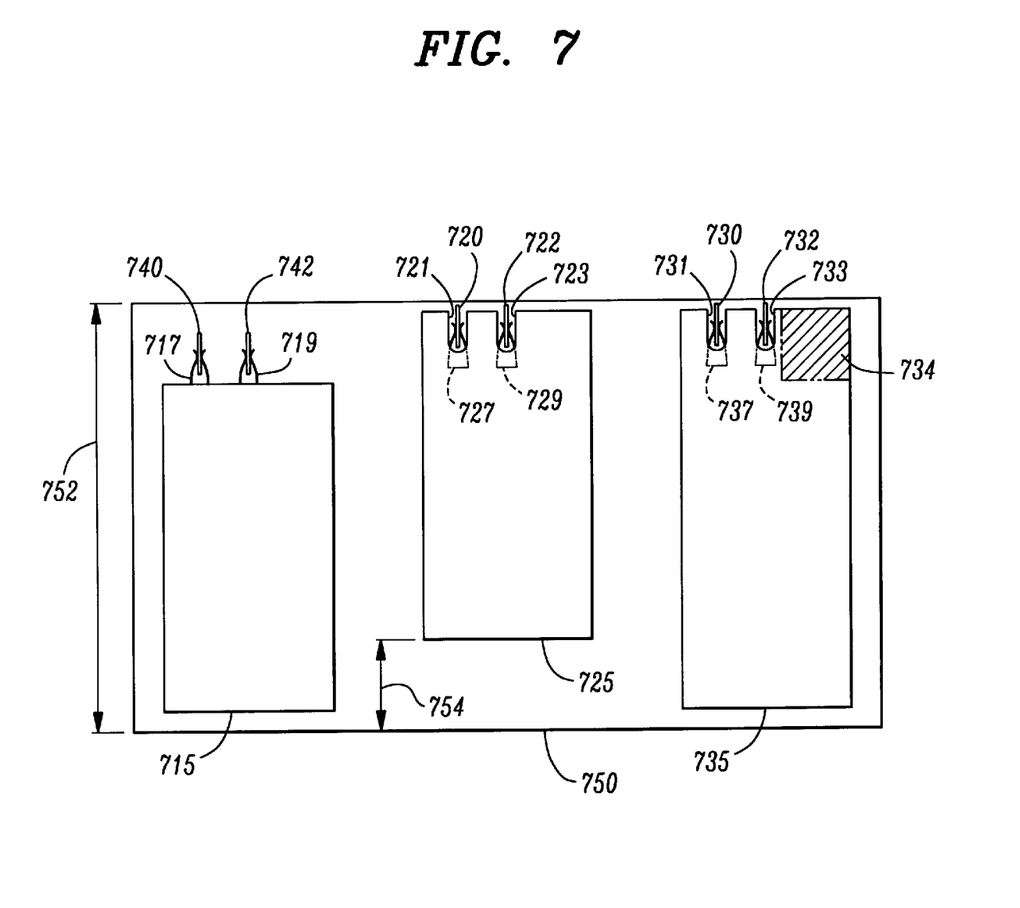
FIG. 7 illustrates a top view of three alternative embodiments of a power supply module constructed according to the principles of the present invention.

Referring now to FIG. 7 illustrated is a top view of three alternative embodiments of a power supply module constructed according to the principles of the present invention. A first module 715 illustrates the engagement of a power supply module as described above to a pair of conductors 740, 742. In this embodiment, terminal connectors 717, 719 are external to the power supply module 715. Previous embodiments have illustrated two conductors laminated to an insulator with terminal connectors contacting the two different electrical polarities on the faces of the bus bar. In the illustrated embodiment, the conductors are separated into two bus bars 740, 742 with electrical contact being made through terminal connectors 717, 719 respectively. One skilled in the art will recognize that the embodiment of FIG. 7 demonstrates that the number of conductors and their physical arrangement is in no way a limitation of the present invention. A shelf 750 having a shelf depth as represented by dimensional arrow 752 illustrates the depth necessary for this configuration.

A second power supply module 725 illustrates an embodiment of a power supply module in which terminal connectors 727, 729 are located within the power supply module 725 of the same volume as the first power supply module 715. Contact between bus bars 720, 722 and their respective terminal connectors 727, 729 is achieved by configuring cavities 721, 723 vertically through the end of the second power supply module 725. Bus bars 720, 722 pass vertically through their respective cavities 721, 723. By including the terminal connectors 727, 729 within the power supply module, the shelf 750 can be foreshortened by a distance represented by a dimensional arrow 754, yielding a cabinet which is optimized for system depth.

Alternatively, the third power supply module 735 illustrates an embodiment of the power supply module with internal terminal connectors 737, 739, using the same shelf area as referenced above. As in the second power supply module 725, contact between bus bars 730, 732 and their respective terminal connectors 737, 739 is achieved by configuring cavities 731, 733 vertically through the end of the power supply module 735. Bus bars 730, 732 pass vertically through their respective cavities 731, 733. In this configuration, an area represented by a region 734 illustrates the area gained within the third power supply module 735 over the first power supply module 715 while maintaining the same overall shelf depth represented by an arrow 752.

The configuration for the second and third power modules 725, 735 provide the additional benefits of: (a) electrical connections are more secure because the terminal connectors are protected from damage by the module case, and (b) potentially sharp edges of the connectors are shrouded from the handler, thereby increasing safety. Additionally, since the power modules are most frequently handled from the front, the modules 725, 735 may now be stood on end while awaiting installation in the power system.

Figure 8:
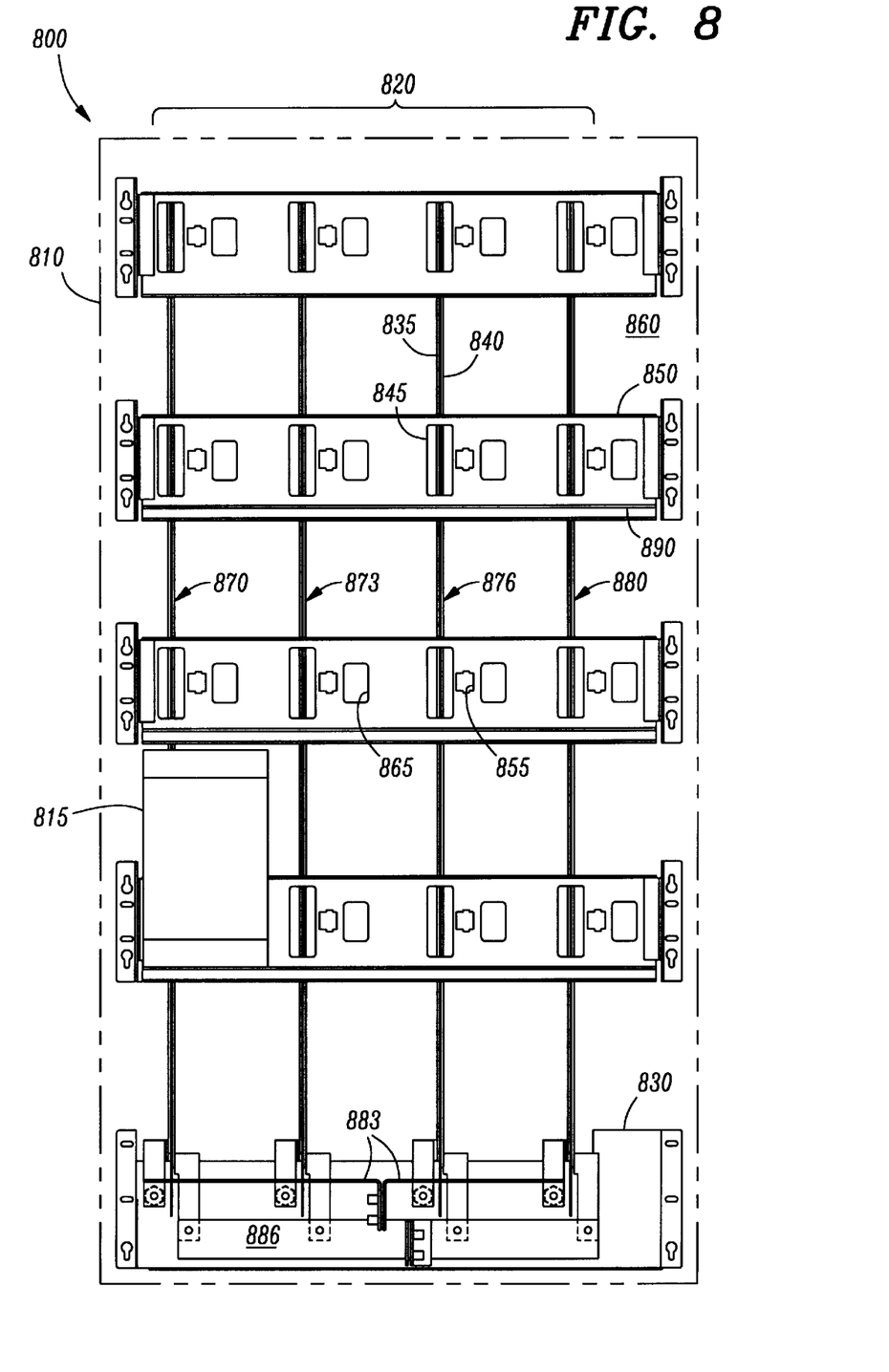
FIG. 8 illustrates a front view of an embodiment of a chassis assembly constructed according to the principles of the present invention.

Referring now to FIG. 8, illustrated is a front view of an embodiment of a chassis assembly 800 constructed according to the principles of the present invention. The chassis assembly 800 includes a cabinet 810 having compartmentalized panels (not shown) formed of sheet metal to cover the power supply modules (one of which is illustrated and designated 815) and other components that make-up a modular power supply. The chassis assembly 800 also includes an elongated bus bar assembly or bus bar assembly (generally designated 820) supported within the cabinet 810 from a mount 830 coupled to the cabinet 810. The bus bar assembly 820 includes a pair of conductors (one pair of which is referenced as 835, 840) having terminal connectors (one of which is referenced as 845) associated therewith for receiving output terminals of the power supply modules 815 received into the cabinet 810. The bus bar assembly 820 is adapted to eliminate a need for support of a portion of a weight of the bus bar assembly 820 apart from the mount 830.

The chassis assembly 800 further includes a plurality of shelves (one of which is referenced as 850) oriented laterally with respect to the bus bar assembly 820 and located proximate the terminal connectors 845. The plurality of shelves 850 provide a resting location for the plurality of power supply modules 815 coupled to the terminal connectors 845. The chassis assembly 800 still further includes a central rectifier control system having a plurality of control bus interfaces (one of which is referenced as 855) distributed within the cabinet 810 to allow the central rectifier control system to coordinate the operation of the plurality of power supply modules 815.

The plurality of shelves 850 also include a plurality of power outlets (one of which is referenced as 865) associated therewith and proximate the terminal connectors 845. The plurality of power outlets 865 mate with and provide electrical power to the plurality of power supply modules 815. The terminal connectors 845 mate with and receive converted electrical power from the plurality of power supply modules. Of course, the control bus interfaces 855 and power outlets 865 may be located at other locations within the cabinet 810 such as on a rear wall 860 of the cabinet 810.

In the illustrated embodiment, the bus bar assembly 820, includes four parallel pairs of conductors (a first, second, third and fourth vertical conductor 870, 873, 876, 880) and a pair of cross-connecting conductors (a first and second cross-connecting conductor 883, 886) that electrically couple corresponding conductors of the four parallel pairs of conductors 870, 873, 876, 880. Of course, the present invention is in no way limited by the number of conductor pairs provided in a given cabinet or the spacing of the conductor pairs.

The chassis assembly 800 further includes a plurality of lateral support members (one of which is referenced as 890) that couple the bus bar assembly 820 to the plurality of shelves 850. The plurality of lateral support members 890 limit a lateral movement of the bus bar assembly 820 relative to the plurality of shelves 850. Inasmuch as the mount 830 bears a substantial portion of the weight of the bus bar assembly 820, ancillary supports (such as the lateral support members 890) are not required.

Figure 9:
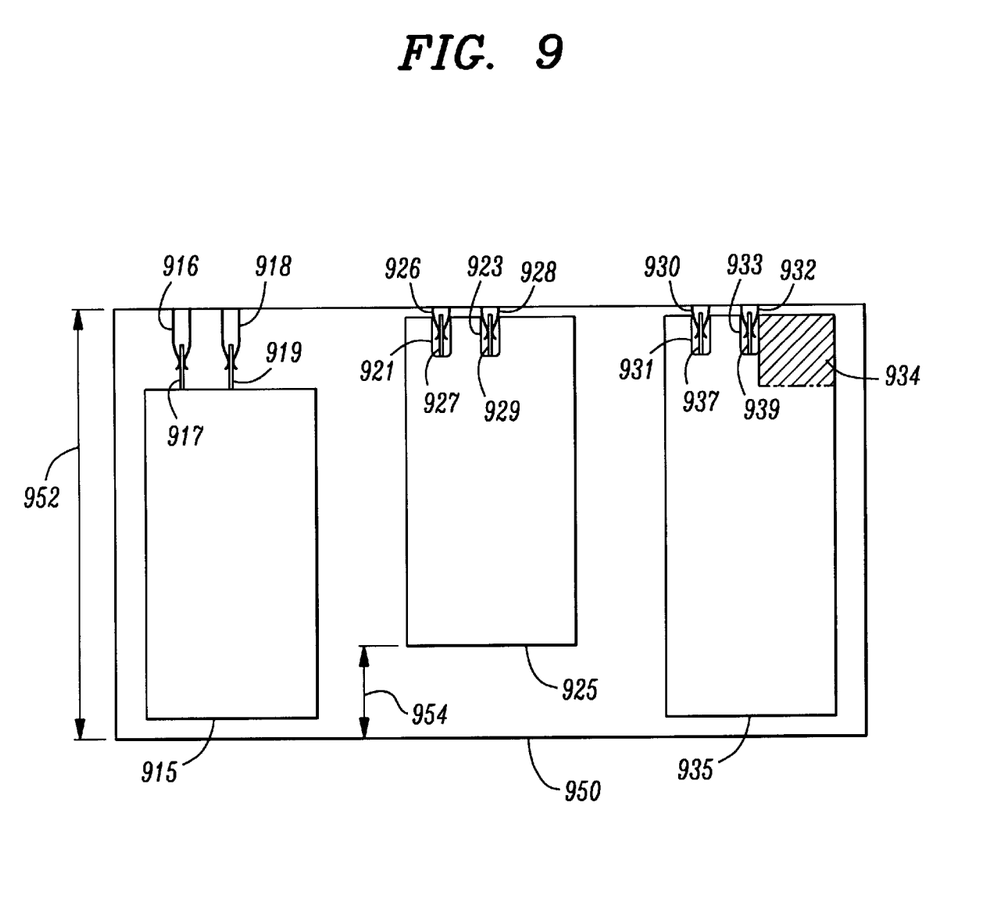
FIG. 9 illustrates a top view of three alternative embodiments of a power supply module constructed according to the principles of the present invention.

Referring now to FIG. 9, illustrated is a top view of three alternative embodiments of a power supply module constructed according to the principles of the present invention. A first module 915 illustrates the engagement of a power supply module as described above to terminal connectors 916, 918 of a pair of conductors. In this embodiment, output terminals 917, 919 are external to the power supply module 915. One skilled in the art will recognize that the embodiment of FIG. 9 demonstrates that the number of conductors and their physical arrangement is in no way a limitation of the present invention. A shelf 950 having a shelf depth as represented by dimensional arrow 952 illustrates the depth necessary for this configuration.

A second power supply module 925 illustrates an embodiment of a power supply module in which terminal connectors 926, 928 engage output terminals 927, 929 within the power supply module 925 of the same volume as the first power supply module 915. Contact between the terminal connectors 926, 928 and the respective output terminals 927, 929 is achieved by configuring cavities 921, 923 vertically through the end of the second power supply module 925. The terminal connectors 926, 928 pass vertically through the respective cavities 921, 923. As a result, the shelf 950 can be foreshortened by a distance represented by a dimensional arrow 954, yielding a cabinet which is optimized for system depth.

Alternatively, the third power supply module 935 illustrates an embodiment of the power supply module with internal output terminals 937, 939, using the same shelf area as referenced above. As in the second power supply module 925, contact between the terminal connectors 930, 932 and the respective output terminals 937, 939 is achieved by configuring cavities 931, 933 vertically through the end of the power supply module 935. The terminal connectors 930, 932 pass vertically through the respective cavities 931, 933. In this configuration, an area represented by a region 934 illustrates the area gained within the third power supply module 935 over the first power supply module 915 while maintaining the same overall shelf depth represented by an arrow 952.

It should be clear that while the present invention has been expressly illustrated with respect to a modular power supply, the principles are equally applicable to any modular system.

Although the present invention has been described in detail, those skilled in the art should understand that they can make various changes, substitutions and alterations herein without departing from the spirit and scope of the invention in its broadest form.

What is claimed is:

1. A chassis assembly for receiving power supply modules therein, comprising:
    a cabinet;
    an elongated bus bar assembly configured to be supported within said cabinet from a mount coupled to said cabinet, said bus bar assembly having a pair of conductors for receiving a terminal connector of a power supply module received into said cabinet; and
    a shelf, oriented laterally with respect to said bus bar assembly, that supports at least one power supply module received into said cabinet, said bus bar assembly being substantially free of terminal connectors and adapted to eliminate a need for support of a portion of a weight of said bus bar assembly apart from said mount.

2. The chassis assembly as recited in claim 1 wherein said shelf comprises a power outlet and a control bus interface associated therewith, said power outlet configured to mate with and provide electrical power to said power supply module, said control bus configured to mate with and provide control signals to said power supply module.

3. The chassis assembly as recited in claim 1 wherein said bus bar assembly comprises a plurality of pairs of conductors and a pair of cross-connecting conductors that electrically couple corresponding conductors of said plurality of pairs of conductors.

4. The chassis assembly as recited in claim 1 further comprising a lateral support member coupling said bus bar assembly and said shelf, said lateral support member limiting a lateral movement of said bus bar assembly relative to said shelf.

5. The chassis assembly as recited in claim 1 wherein said cabinet comprises a rear wall, a rear edge of said shelf being separated from said rear wall to form a passageway, said bus bar assembly passing through said passageway, said passageway providing a path for convective air currents within said cabinet.

6. The chassis assembly as recited in claim 1 wherein said terminal connectors comprise opposing spring-biased contacts adapted to spread apart resiliently about said pair of conductors.

7. The chassis assembly as recited in claim 1 wherein an insulating structure separates said pair of conductors and maintains said pair of conductors in a fixed relative relationship.

8. The chassis assembly as recited in claim 1 wherein said terminal connector is located in a cavity of said power supply module.

9. The chassis assembly as recited in claim 1 wherein said power supply module further comprises a further terminal connector, said terminal connector engaging a first conductor of said pair of conductors and said further terminal connector engaging a second conductor of said pair of conductors.

10. A chassis assembly for receiving rectifier modules therein, comprising:

a cabinet having an open front face;

an elongated bus bar assembly configured to be vertically suspended within said cabinet from a mount connected to said cabinet at an upper end thereof, said bus bar assembly having parallel pairs of conductors, each of said parallel pairs of conductors being separated by an insulating structure and for receiving a terminal connector of a rectifier module received into said cabinet;

a horizontal shelf, oriented laterally with respect to said bus bar assembly, configured to support said rectifier modules received into said cabinet; and a lateral support member coupling said bus bar assembly and said shelf, said lateral support member limiting a lateral movement of said bus bar assembly relative to said shelf, said bus bar assembly being substantially free of terminal connectors and configured to be suspended to eliminate a need for further vertical support of said bus bar assembly.

11. The chassis assembly as recited in claim 10 wherein said shelf comprises power outlets and control bus interfaces associated therewith, said power outlets configured to mate with and provide electrical power to said rectifier modules, said control bus configured to mate with and provide control signals to said rectifier modules.

12. The chassis assembly as recited in claim 10 wherein said bus bar assembly comprises a pair of cross-connecting conductors that electrically couple corresponding conductors of said parallel pairs of conductors.

13. The chassis assembly as recited in claim 10 wherein said shelf has rails for aligning said rectifier modules on said shelf.

14. The chassis assembly as recited in claim 10 wherein said cabinet comprises a rear wall, a rear edge of said shelf being separated from said rear wall to form a passageway, said bus bar assembly passing through said passageway, said passageway providing a path for convective air currents within said cabinet.

15. The chassis assembly as recited in claim 10 wherein said terminal connectors comprise opposing spring-biased contacts adapted to spread apart resiliently about said parallel pairs of conductors.

16. The chassis assembly as recited in claim 10 further comprising a central rectifier control system having control bus interfaces distributed within said cabinet to allow said central rectifier control system to coordinate an operation of said rectifier modules coupled thereto.

17. The chassis assembly as recited in claim 10 wherein said terminal connector is located in a cavity of said rectifier module.

18. The chassis assembly as recited in claim 10 wherein said rectifier module further comprises a further terminal connector, said terminal connector engaging a first conductor of said pair of conductors and said further terminal connector engaging a second conductor of said pair of conductors.

19. A modular rectifier, comprising:

a cabinet;

an elongated bus bar assembly configured to be supported within said cabinet from a mount coupled to said cabinet, said bus bar assembly having a pair of conductors, said bus bar assembly being substantially free of terminal connectors and adapted to eliminate a need for support of a portion of a weight of said bus bar assembly apart from said mount;

shelves oriented laterally with respect to said bus bar assembly;

rectifier modules resting on said plurality of shelves, said pair of conductors capable of receiving a terminal connector of a rectifier module received into said cabinet; and a central rectifier control system having control bus interfaces distributed within said cabinet to allow said central rectifier control system to coordinate an operation of said rectifier modules.

20. The rectifier as recited in claim 19 wherein said shelves comprise power outlets associated therewith, said power outlets configured to mate with and provide electrical power to said rectifier modules.

21. The rectifier as recited in claim 19 wherein said bus bar assembly comprises parallel pairs of conductors and a pair of cross-connecting conductors that electrically couple corresponding conductors of said parallel pairs of conductors.

22. The rectifier as recited in claim 19 further comprising lateral support members coupling said bus bar assembly and said shelves, said lateral support members limiting a lateral movement of said bus bar assembly relative to said shelves.

23. The rectifier as recited in claim 19 wherein said cabinet comprises a rear wall, a rear edge of each of shelves being separated from said rear wall to form a passageway, said bus bar assembly passing through said passageway, said passageway providing a path for convective air currents within said cabinet.

24. The rectifier as recited in claim 19 wherein said terminal connectors comprise opposing spring-biased contacts adapted to spread apart resiliently about said pair of conductors.

25. The rectifier as recited in claim 19 wherein an insulating structure separates said pair of conductors and maintains said pair of conductors in a fixed relative relationship.

26. The chassis assembly as recited in claim 19 wherein said terminal connector is located in a cavity of said rectifier module.

27. The chassis assembly as recited in claim 19 wherein said rectifier module further comprises a further terminal connector, said terminal connector engaging a first conductor of said pair of conductors and said further terminal connector engaging a second conductor of said pair of conductors.

28. A chassis assembly for receiving power supply modules therein, comprising:

a cabinet;

an elongated bus bar assembly configured to be supported within said cabinet from a mount coupled to said cabinet, said bus bar assembly having a pair of conductors, said pair of conductors having terminal connectors associated therewith for receiving output terminals of a power supply module received into said cabinet; and a shelf, oriented laterally with respect to said bus bar assembly and located proximate said terminal connectors, that supports at least one power supply module received into said cabinet, said bus bar assembly adapted to eliminate a need for support of a portion of a weight of said bus bar assembly apart from said mount.

29. The chassis assembly as recited in claim 28 wherein said shelf comprises a power outlet and a control bus interface associated therewith and proximate said terminal connectors, said power outlet configured to mate with and provide electrical power to said power supply module, said control bus configured to mate with and provide control signals to said power supply module, said terminal connectors configured to mate with and receive electrical power from said power supply module.

30. The chassis assembly as recited in claim 28 wherein said bus bar assembly comprises a plurality of pairs of conductors and a pair of cross-connecting conductors that electrically couple corresponding conductors of said plurality of pairs of conductors.

31. The chassis assembly as recited in claim 28 further comprising a lateral support member coupling said bus bar assembly and said shelf, said lateral support member limiting a lateral movement of said bus bar assembly relative to said shelf.

32. The chassis assembly as recited in claim 28 wherein said cabinet comprises a rear wall, a rear edge of said shelf being separated from said rear wall to form a passageway, said bus bar assembly passing through said passageway, said passageway providing a path for convective air currents within said cabinet.

33. The chassis assembly as recited in claim 28 wherein said terminal connectors comprise opposing spring-biased contacts conductively mounted to each of said pair of conductors, said terminal connectors adapted to spread apart resiliently to receive said output terminals of said power supply module.

34. The chassis assembly as recited in claim 28 wherein an insulating structure separates said pair of conductors and maintains said pair of conductors in a fixed relative relationship.

35. A modular rectifier, comprising:

a cabinet;

an elongated bus bar assembly configured to be supported within said cabinet from a mount coupled to said cabinet, said bus bar assembly having a pair of conductors, said pair of conductors having terminal connectors associated therewith for receiving output terminals of rectifier modules received into said cabinet, said bus bar assembly adapted to eliminate a need for support of a portion of a weight of said bus bar assembly apart from said mount;

a plurality of shelves, oriented laterally with respect to said bus bar assembly and located proximate said terminal connectors;

a plurality of rectifier modules resting on said plurality of shelves and coupled to said terminal connectors; and a central rectifier control system having a plurality of control bus interfaces distributed within said cabinet to allow said central rectifier control system to coordinate an operation of said plurality of rectifier modules.

36. The rectifier as recited in claim 35 wherein said plurality of shelves comprise power outlets associated therewith and proximate said terminal connectors, said plurality of power outlets configured to mate with and provide electrical power to said plurality of rectifier modules, said terminal connectors configured to mate with and receive rectified electrical power from said plurality of rectifier modules.

37. The rectifier as recited in claim 35 wherein said bus bar assembly comprises a plurality of parallel pairs of conductors and a pair of cross-connecting conductors that electrically couple corresponding conductors of said plurality of parallel pairs of conductors.

38. The rectifier as recited in claim 35 further comprising a plurality of lateral support members coupling said bus bar assembly and said plurality of shelves, said plurality of lateral support members limiting a lateral movement of said bus bar assembly relative to said plurality of shelves.

39. The rectifier as recited in claim 35 wherein said cabinet comprises a rear wall, a rear edge of each of said plurality of shelves being separated from said rear wall to form a passageway, said bus bar assembly passing through said passageway, said passageway providing a path for convective air currents within said cabinet.

40. The rectifier as recited in claim 35 wherein said terminal connectors comprise opposing spring-biased contacts conductively mounted to each of said pair of conductors, said terminal connectors adapted to spread apart resiliently to receive said output terminals of said plurality of rectifier modules.

41. The rectifier as recited in claim 35 wherein an insulating structure separates said pair of conductors and maintains said pair of conductors in a fixed relative relationship.

* * * * *